US008266921B2

(12) United States Patent
Tashiro

(10) Patent No.: US 8,266,921 B2
(45) Date of Patent: Sep. 18, 2012

(54) DATA CENTER

(75) Inventor: Kanji Tashiro, Hitachinaka (JP)

(73) Assignee: Hitachi Cable, Ltd., Tokyo (JP)

( * ) Notice: Subject to any disclaimer, the term of this patent is extended or adjusted under 35 U.S.C. 154(b) by 520 days.

(21) Appl. No.: 12/457,838

(22) Filed: Jun. 23, 2009

(65) Prior Publication Data

US 2010/0064714 A1 Mar. 18, 2010

(30) Foreign Application Priority Data

Sep. 16, 2008 (JP) ................................. 2008-236437

(51) Int. Cl.
*F25D 23/12* (2006.01)

(52) U.S. Cl. ..................................... 62/259.2

(58) Field of Classification Search ................. 62/259.2, 62/129, 157, 186, 176.6, 428, 419, 408; 165/104.33, 165/122; 454/184, 237; 361/695, 696
See application file for complete search history.

(56) References Cited

U.S. PATENT DOCUMENTS

| | | | |
|---|---|---|---|
| 6,859,366 B2 | 2/2005 | Fink | |
| 7,259,963 B2 * | 8/2007 | Germagian et al. | 361/695 |
| 7,403,391 B2 * | 7/2008 | Germagian et al. | 361/695 |
| 2003/0067745 A1 * | 4/2003 | Patel et al. | 361/690 |
| 2004/0020224 A1 * | 2/2004 | Bash et al. | 62/228.4 |
| 2004/0065097 A1 * | 4/2004 | Bash et al. | 62/180 |
| 2004/0089011 A1 * | 5/2004 | Patel et al. | 62/259.2 |

(Continued)

FOREIGN PATENT DOCUMENTS

JP 2-282635 A 11/1990

(Continued)

OTHER PUBLICATIONS

Notification of Reason(s) for Refusal dated Nov. 30, 2010, with English translation.

(Continued)

*Primary Examiner* — Mohammad Ali
(74) *Attorney, Agent, or Firm* — McGinn IP Law Group, PLLC

(57) ABSTRACT

A data center includes an air-conditioned room, two rack rows formed on a floor surface of the air-conditioned room and each composed of a plurality of racks arranged in a horizontal direction, each of the plurality of racks housing electronic devices in multistage configuration, an air conditioner for conditioning air in the air-conditioned room to eliminate heat generated from the electronic devices housed in the plurality of racks, and a hot zone in the air-conditioned room. The hot zone is defined by the two rack rows arranged on the floor surface of the air-conditioned room such that rear sides thereof are opposite each other at a distance, a ceiling disposed above the two rack rows, two panels disposed at both ends of the two rack rows in the horizontal direction and extending from a lower end of the two rack rows to the ceiling, and two partitions disposed at an upper front top end of the two rack rows and extending to the ceiling. The ceiling includes an exhaust port for discharging heat in the hot zone, and the air conditioner is operable to introduce air-conditioned air from the air-conditioned room through front sides and then the rear sides of the two rack rows into the hot zone. The data center further includes a heat recovery means for recovering a heat of the air discharged through the exhaust port from the hot zone before cooling down the air by the air conditioner.

13 Claims, 6 Drawing Sheets

U.S. PATENT DOCUMENTS

| | | |
|---|---|---|
| 2004/0099747 A1 | 5/2004 | Johnson et al. |
| 2004/0184232 A1 | 9/2004 | Fink |
| 2005/0075065 A1* | 4/2005 | Nair .............................. 454/186 |
| 2005/0170770 A1 | 8/2005 | Johnson et al. |
| 2006/0091229 A1* | 5/2006 | Bash et al. ................... 236/49.3 |
| 2006/0139877 A1* | 6/2006 | Germagian et al. .......... 361/695 |
| 2007/0017233 A1* | 1/2007 | Hawkins ........................... 62/63 |
| 2009/0308579 A1 | 12/2009 | Johnson et al. |

FOREIGN PATENT DOCUMENTS

| | | |
|---|---|---|
| JP | 8-320155 | 12/1996 |
| JP | 2001-41554 A | 2/2001 |
| JP | 2002-61911 A | 2/2002 |
| JP | 2002-156136 A | 5/2002 |
| JP | 2003-35441 A | 2/2003 |
| JP | 2004-184070 A | 7/2004 |
| JP | 3835615 | 7/2004 |
| JP | 2006-64303 | 3/2006 |
| JP | 2006-507606 T | 3/2006 |
| JP | 2006-127283 A | 5/2006 |
| JP | 2006-526205 | 11/2006 |
| JP | 2007-285082 | 11/2007 |
| JP | 2007-316989 | 12/2007 |
| JP | 2008-502082 | 1/2008 |
| JP | 2008-84173 A | 4/2008 |
| JP | 2008-96030 A | 4/2008 |
| WO | WO 2004/049773 A2 | 6/2004 |
| WO | 2005/122664 A1 | 12/2005 |

OTHER PUBLICATIONS

Notification of Reason(s) for Refusal dated Jul. 27, 2010, with English translation.

Decision of Refusal dated Feb. 22, 2011, with English translation.

Decision of Refusal dated Dec. 28, 2010, with English translation.

Notification of Reason(s) for Refusal dated Jun. 5, 2012, with English translation.

* cited by examiner

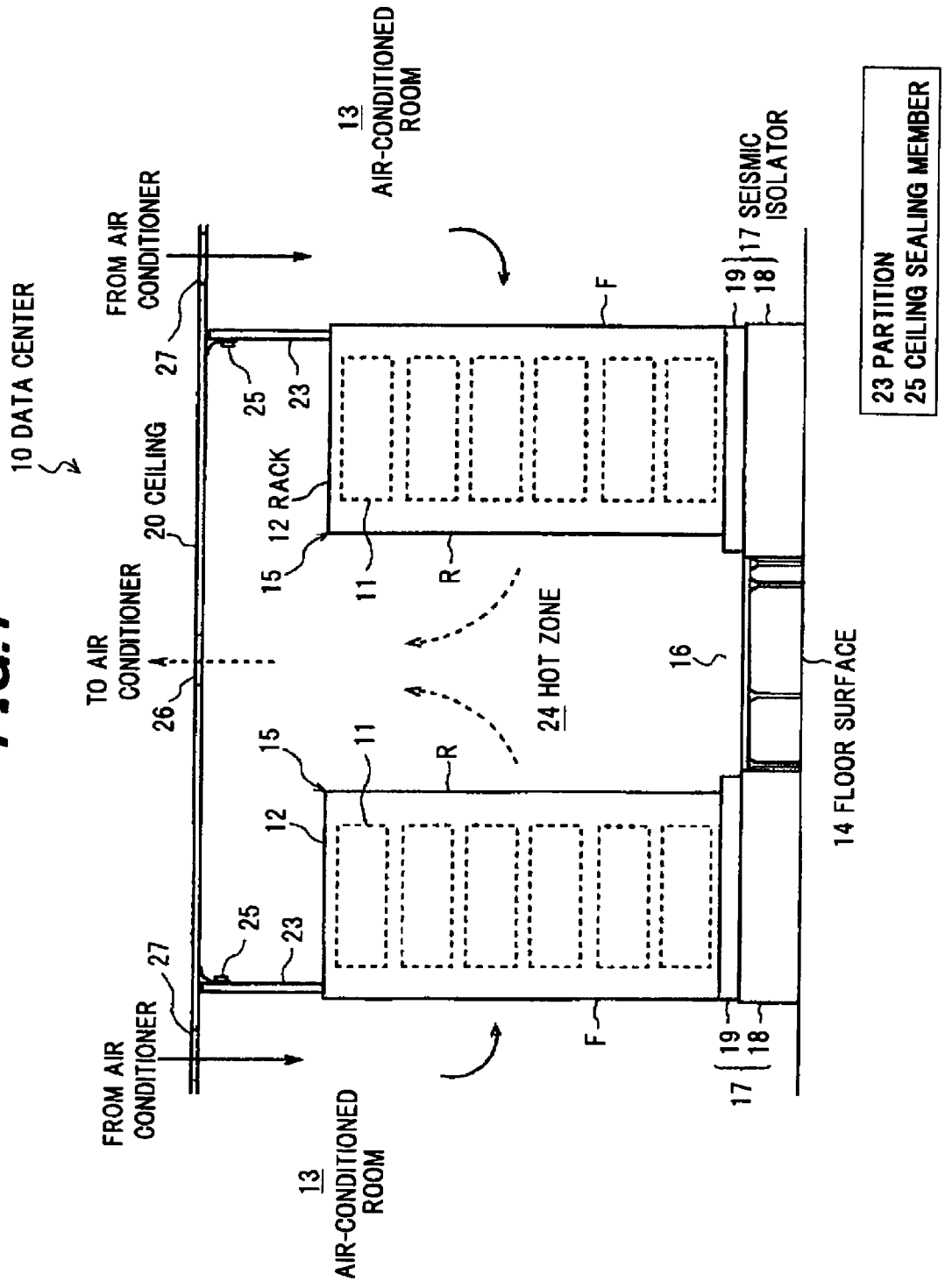

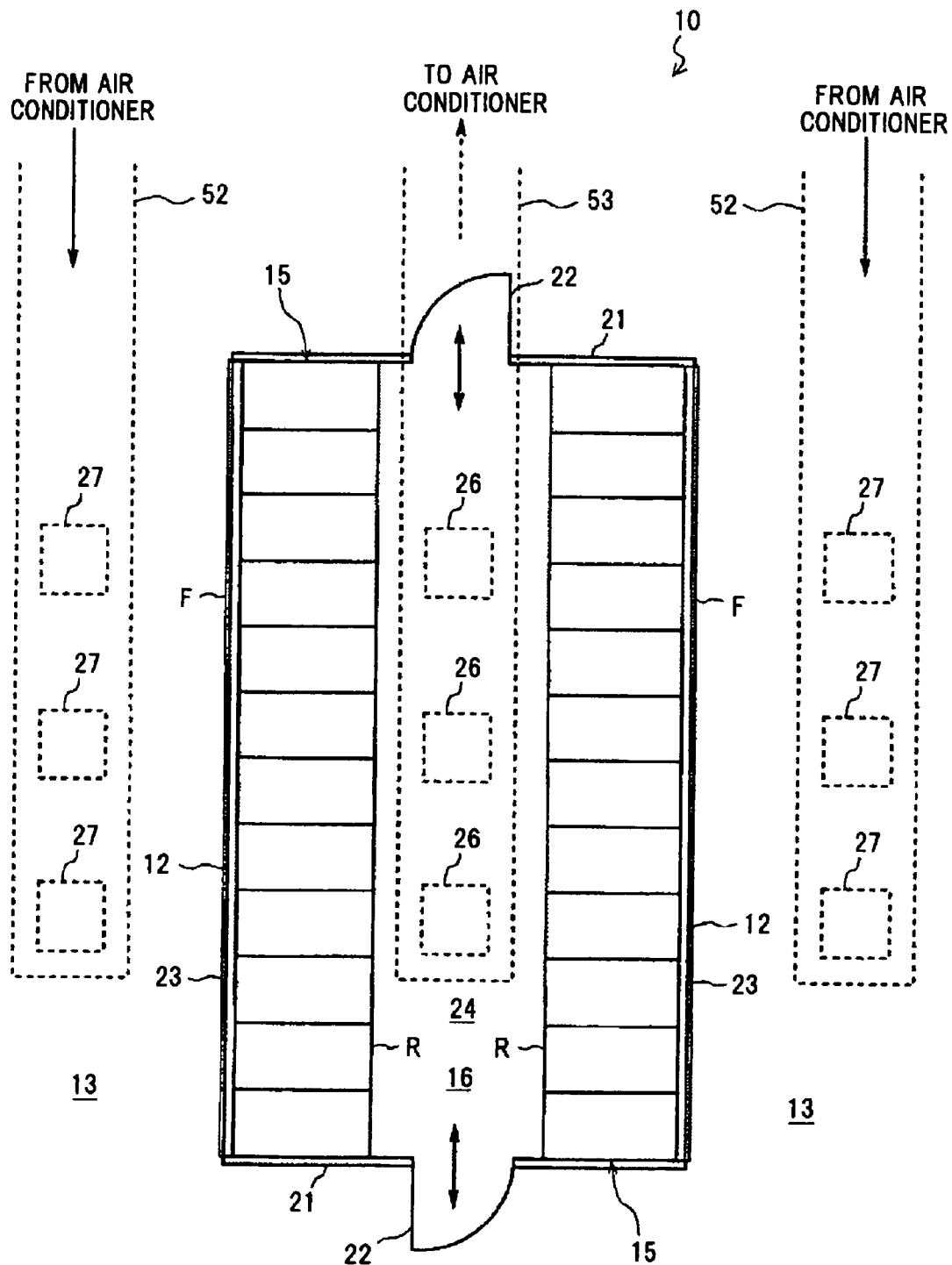

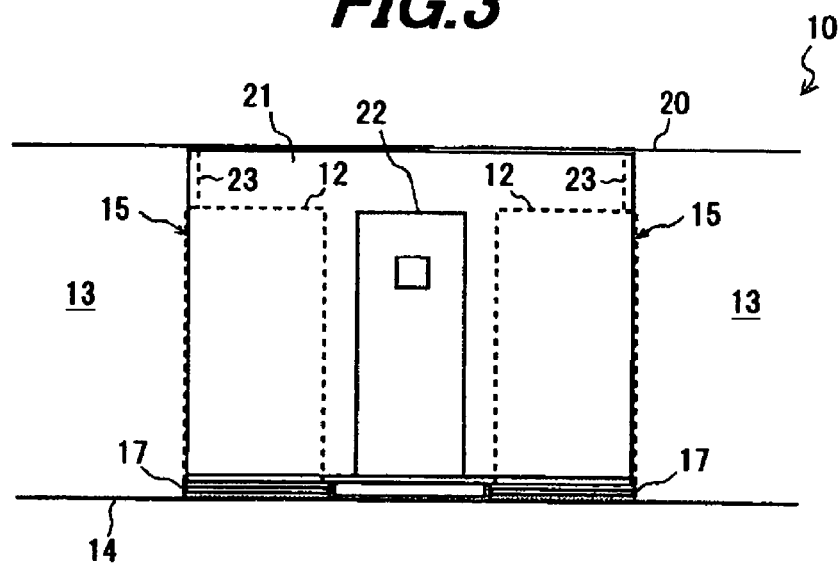
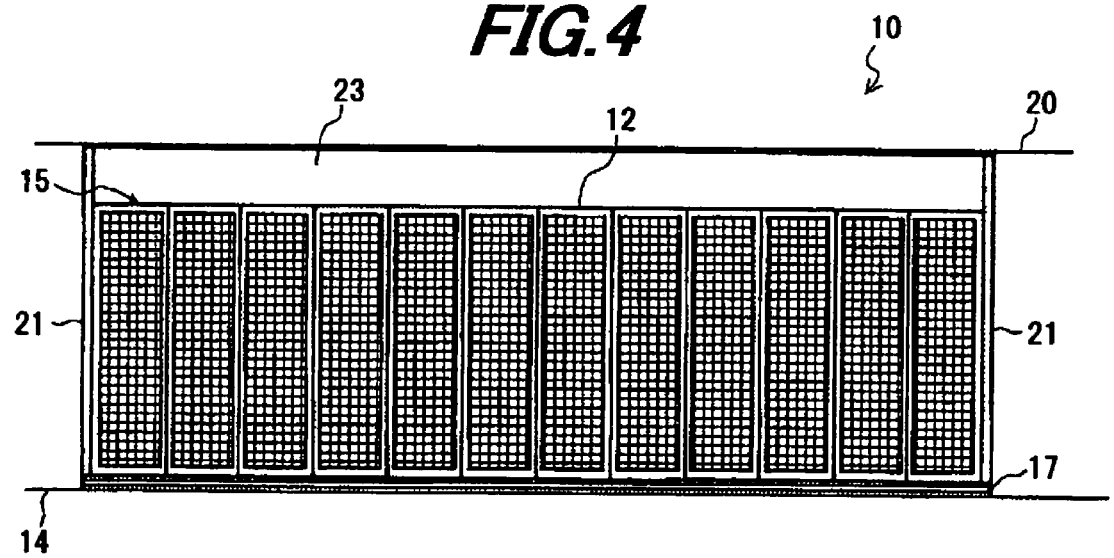

| 70 MODULAR DATA CENTER |
| 71 RACK |
| 72 RACK ROW |
| 74 ROOF PANEL |
| 75 DOOR |
| 76 COOLANT SUPPLY/RETURN PIPE |
| 77 POWER SUPPLY LINE |

DATA CENTER

The present application is based on Japanese Patent Application No. 2008-236437 filed on Sep. 16, 2008, the entire contents of which are incorporated herein by reference.

BACKGROUND OF THE INVENTION

1. Field of the Invention

The invention relates to a data center that heat generated from an electronic device such as a server housed in a rack can be efficiently eliminated.

2. Related Art

In general, electronic devices such as a server, etc., are housed in racks with high density in multi-tiers, and are arranged in an air-conditioned room. Since heat is generated in the electronic device in accordance with power consumption, air-conditioned air (cool air) is generally supplied to the electronic device housed in the rack by a cooling system such as an air conditioner for removing the heat generated in the electronic device in order to eliminate an adverse effect due to the heat.

As shown in FIG. 7, a conventional data center is entirely configured by providing one or plural so-called modular data centers 70 in an air-conditioned room, the modular data center 70 in which rack rows 72 are formed in an air-conditioned room by horizontally aligning plural racks 71 housing electronic devices such as a server, etc., the rack rows 72 are arranged on a floor surface so that rear sides thereof face each other at a distance, the air-conditioned room is divided by providing a door 75 and a roof panel 74 in a horizontal direction of the face-to-face rack rows 72, i.e., on edge sides in a longitudinal direction so as to block a gap between the rack rows 72 for defining a hot zone between the back-to-back rack rows 72 on the rear sides thereof (for example, see JP-A 2006-526205). The door 75 is for entering inside the hot zone.

In addition, in a data center of JP-A 2006-526205 in which the modular data centers 70 is provided in the air-conditioned room, one of the racks 71 incorporates a cooling device (an air conditioner), and the air in the hot zone is cooled down and exhausted to the front side of the rack 71. In other words, in the modular data centers 70, air-conditioned air (cool air) is introduced from the front side of the rack 71 for removing the heat generated in the electronic device in the rack 71, the heat-absorbed air is exhausted to the hot zone from the rear side of the rack 71, and the air in the hot zone is cooled down by the cooling device and is exhausted to the front side of the rack 71.

A coolant supply and return pipe 76 for supplying a coolant such as water or chlorofluorocarbon, etc., is connected to the cooling device which is housed in the rack 71. Electric power is supplied to each electronic device in the rack 71 via a power supply line 77.

Thus, it is possible to effectively operate the cooling device by concentrating heat generated in the electronic device in a specific space (a hot zone). In other words, since it is not necessary to supply a low-temperature coolant equivalent to that for general air-conditioning facilities to the cooling device, it is possible to efficiently produce air-conditioned air (cool air) at a low cost without dehumidification.

However, in the above-mentioned data center, the heat generated in the electronic device is discharged into the air-conditioned room from an upper surface of the rack 71 (the rack row 72) and an upper surface of the roof panel 74 which may cause mixture of the heat with air-conditioned air (cool air) produced by the cooling device which is blown from the front side of the rack 71, and a result of the mixture, when it is not possible to sufficiently cool down the temperature of the air-conditioned air (cool air) introduced from the front side of the rack 71, it is necessary to further cool down the air-conditioned air beforehand by an air conditioner (an indoor air conditioner) other than the cooling device which is incorporated in the modular data center 70. Under these circumstances, energy consumed in the air conditioner (the indoor air conditioner) is wasted, thus, there is a problem from the viewpoint of energy saving.

Since there is a type of server which exhausts the air upwards, when such a server is housed in the rack 71, a large amount of heat is discharged from the upper surface of the rack 71 into the air-conditioned room, thus, the above-mentioned problem remarkably occurs.

THE SUMMARY OF THE INVENTION

Therefore, it is an object of the invention to provide a data center that reduces energy consumption in an air-conditioned room by efficiently eliminating heat generated from the electronic device in the rack, and to effectively use heat concentrated in a hot zone defined therein.

(1) According to one embodiment of the invention, a data center comprises:

an air-conditioned room;

two rack rows formed on a floor surface of the air-conditioned room and each composed of a plurality of racks arranged in a horizontal direction, each of the plurality of racks housing electronic devices in multistage configuration;

an air conditioner for conditioning air in the air-conditioned room to eliminate heat generated from the electronic devices housed in the plurality of racks; and a hot zone in the air-conditioned room, the hot zone being defined by the floor surface, the two rack rows arranged on the floor surface of the air-conditioned room such that rear sides thereof are opposite each other at a distance, a ceiling disposed above the two rack rows, two panels disposed at both ends of the two rack rows in the horizontal direction and extending from a lower end of the two rack rows to the ceiling, and two partitions disposed at a front top end of the two rack rows and extending to the ceiling, wherein the ceiling comprises an exhaust port for discharging air in the hot zone from the hot zone, the air conditioner is operable to introduce air-conditioned air from the air-conditioned room through front sides and then the rear sides of the two rack rows into the hot zone, and the data center further comprises a heat recovery means for recovering a heat of the air discharged through the exhaust port from the hot zone before cooling down the air by the air conditioner.

In the above embodiment (1), the following modifications and changes can be made.

(i) The heat recovery means comprises a heat capture coil for recovering a heat from the air discharged through the exhaust port, and the heat capture coil is integrated with the air conditioner.

(ii) The air conditioner comprises a fan for sucking the air in the hot zone and a dry coil disposed at a downstream side of the fan for cooling down the air sent through the fan and for blowing out the air-conditioned air, and the heat capture coil is disposed at the downstream side of the fan and at an upstream side of the dry coil.

(iii) The heat capture coil is adapted to recover a heat of the air sent through the fan and to convert the heat into a heat of a heating medium, the heat capture coil comprises a heat recovery controller for controlling a flow rate of the heating medium so as to maximize a temperature of the heating medium, and the dry coil comprises a cooling controller for controlling a flow rate of a coolant so as to have a predetermined temperature of the air-conditioned air after passing through the dry coil.

(iv) The fan comprises a rotation speed controller for controlling a rotation speed of the fan so as to keep the air sucked from the hot zone in a predetermined temperature range or at a predetermined temperature.

(v) The data center further comprises:

an exhaust air duct for connecting the air conditioner with the exhaust port; and an outlet duct for connecting the air conditioner with an outlet port formed in the air-conditioned room except the hot zone, the exhaust air duct and the outlet duct each comprise a temperature sensor, and the fan comprises a rotation speed controller for controlling a rotation speed of the fan based on a temperature difference measured by the temperature sensor so that a temperature difference between the air-conditioned room and the hot zone coincides with a target value.

(vi) At least one of the outlet port is formed on a ceiling of the air-conditioned room except the hot zone, and adapted to blow out the air-conditioned air vertically downward.

Points of the Invention

According to one embodiment of the invention, a data center is constructed such that a hot zone is defined by a floor surface, two rack rows arranged on the floor surface of the air-conditioned room such that rear sides thereof are opposite each other at a distance, a ceiling disposed above the two rack rows, two panels disposed at both ends of the two rack rows in the horizontal direction and extending from a lower end of the two rack rows to the ceiling, and two partitions disposed at a front top end of the two rack rows and extending to the ceiling. Thus, heat discharged from the top of the rack can be discharged not into the air-conditioned room but into the hot zone so that all of heat generated from the electronic device can be concentrated in the hot zone and the air conditioner can be efficiently operated.

Further, in the embodiment, heat of the air discharged through an exhaust port is recovered by a heat recovery means before cooling down the air by the dry coil, thus, it is possible to effectively use heat concentrated in the hot zone without diffusion.

In addition, unlike the conventional data center, the rack rows are completely separated from the air conditioner (i.e., not connected thereto by pipes etc.) or the hot zone and the rack rows are mounted on a seismic isolator, so that, even when a strong earthquake breaks out, there will be no risk that coolant, chlorofluorocarbon etc. leaks out due to breakage of the pipes for coolant, etc., or that the electronic device is damaged due to water falling on the rack row.

BRIEF DESCRIPTION OF THE DRAWINGS

Next, the present invention will be explained in more detail in conjunction with appended drawings, wherein:

FIG. 1 is a schematic cross sectional view showing a data center of the invention;

FIG. 2 is a plan view showing the data center of the invention;

FIG. 3 is a side view showing the data center of the invention;

FIG. 4 is a front view showing the data center of the invention;

DESCRIPTION OF THE PREFERRED EMBODIMENTS

Embodiments

Figure 5:
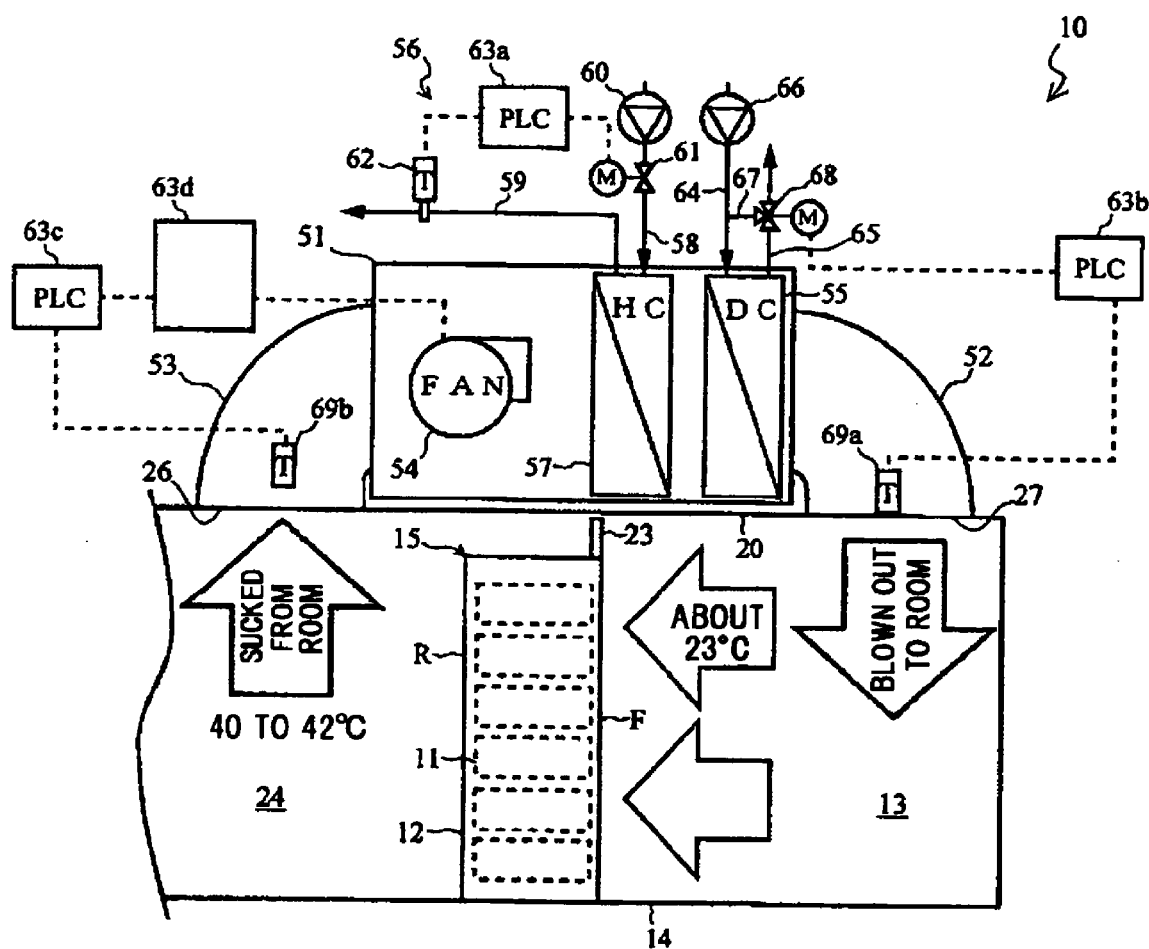
FIG. 5 is a schematic cross sectional view showing an air conditioner and heat recovery means in the data center of the invention.

Preferred embodiments according to the invention will be explained as below in conjunction with appended drawings.

FIG. 1 is a schematic cross sectional view showing a data center in the preferred embodiment, FIG. 2 is a plan view thereof, FIG. 3 is a side view thereof, and FIG. 4 is a front view thereof.

As shown in FIGS. 1 to 4, a data center 10 includes at least a box-shaped air-conditioned room 13 composed of a ceiling, a floor surface and four side walls, a rack row 15 formed by horizontally aligning plural racks 12 housing electronic devices 11 such as a sever, etc., in multi-tiers, and an air conditioner (not shown) for conditioning air inside the air-conditioned room 13 in order to remove heat generated in the electronic device 11 which is housed in the rack 12.

The electronic devices 11, which are equipments for information and communication technology such as a server, a CPU, a network equipment or a storage device, are housed in the racks 12 in multi-tiers.

In the data center 10, the rack row 15 is formed by horizontally aligning the plural racks 12 (twelve racks in the embodiment) on a floor surface 14 of the air-conditioned room 13, and the rack rows 15 are arranged so that rear sides R thereof face each other at a distance. A work passage 16 is formed between the rack rows 15 by arranging the rack rows 15 at a distance.

The rack rows 15 are arranged on the floor surface 14 via a seismic isolator 17. As the seismic isolator 17, a seismic isolation platform 19 is provided on a base 18 via a bearing in the embodiment, however, it is not limited thereto.

Panels 21 extending from a lower edge of the rack row 15 to a ceiling 20 are provided on right and left sides of the rack row 15. A door 22 for entering and leaving the work passage 16 is provided on the panel 21. The panel 21 is provided on the seismic isolator 17.

A partition 23 extending to the ceiling 20 is provided at an upper front edge of each rack row 15. The partition 23 and the panel 21 are provided so that upper edges thereof are movable with respect to the ceiling 20.

A ceiling sealing members 25 for sealing a hot zone 24 and the air-conditioned room 13 is provided at the upper edges of the panel 21 and the partition 23. In the embodiment, a rubber sheet is used as the ceiling sealing member 25, and the rubber sheet is fixed at the upper edge of the partition 23 on the hot zone 24 side by a bolt, etc., so that a top end portion thereof carves toward the hot zone 24 side.

As a result, the hot zone 24, which is divided from the air-conditioned room 13 by the both rack rows 15, the partition 23 and the panel 21, is defined and formed.

At least one exhaust port 26 (three exhaust ports in FIG. 2) for exhausting heat in the hot zone 24 is formed on the ceiling 20 in the hot zone 24. The exhaust port 26 is connected to an inlet port of the air conditioner via an exhaust air duct 53 (see FIG. 2). The exhaust air duct 53 is provided with an exhaust-side temperature sensor 69*b* (see FIG. 5) for measuring a temperature of the air taken from the hot zone 24.

At least one outlet port 27 (three outlet ports in FIG. 2) for blowing out air-conditioned air (cool air) from the air conditioner vertically downward is formed on the ceiling 20 of the air conditioned room 13 excluding the hot zone 24 (the ceiling 20 on a front side of the rack rows 15 in FIG. 1). The outlet port 27 is connected to an outlet port of the air conditioner via an outlet duct 52 (see FIG. 2). The outlet duct 52 is provided with an outlet-side temperature sensor 69*a* (see FIG. 5) for measuring a temperature of the air-conditioned air blown out from the outlet port 27.

As shown in FIG. 5, an air conditioner 51 is provided with a fan 54 for taking the air in the hot zone 24 and a dry coil (DC) 55 provided on a downstream side of the fan 54 for cooling down the air from the fan 54 and for blowing out the air-conditioned air.

In addition, the data center 10 of the embodiment is provided with a heat recovery means 56 for recovering heat of the air exhausted from the exhaust port 26 before cooling down by the dry coil 55 of the air conditioner 51.

The heat recovery means 56 is provided with a heat capture coil (HC) 57 for recovering heat from the air exhausted from the exhaust port 26, a heating medium supply pipe 58 for supplying heating medium to the heat capture coil 57, a heating medium discharge pipe 59 for discharging the heating medium having recovered the heat at the heat capture coil 57 into other equipments such as a boiler, a heating medium pump 60 provided on the heating medium supply pipe 58, a regulator 61 provided on the heating medium supply pipe 58 on a downstream side of the heating medium pump 60, a heating medium temperature sensor 62 for measuring a temperature of the heating medium in the heating medium discharge pipe 59, and a heat recovery controller 63*a* for controlling a flow rate of the heating medium by adjusting an opening of the regulator 61 so that the temperature measured by the heating medium temperature sensor 62 (the temperature of the heating medium) becomes highest. The heat recovery controller 63*a* is composed of a PLC (Programmable Logic Controller).

In the embodiment, water is used as the heating medium. The temperature of the water supplied to the heat capture coil 57 is, e.g., about 20° C., and the temperature of heated water after passing through the heat capture coil 57 is, e.g., about 35-40° C.

The heat capture coil 57 is integrally provided with the air conditioner 51, and is provided on a downstream side of the fan 54 and on an upstream side of the dry coil 55 concurrently. As a result, it is possible to recover not only the heat of the air exhausted from the exhaust port 26 but also the heat generated in the fan 54 by the heat capture coil 57. The air of which heat is recovered by the heat capture coil 57 is cooled down to a predetermined temperature (e.g., about 23° C.) by the dry coil 55 and becomes air-conditioned air.

A coolant supply pipe 64 for supplying the coolant and a coolant return pipe 65 for returning the coolant are connected to the dry coil 55. A coolant pump 66 is provided on the coolant supply pipe 64. The coolant is, e.g., water.

A bypass pipe 67 for bypassing the coolant so as not to pass through the dry coil 55 is connected to the coolant supply pipe 64 and the coolant return pipe 65, and a three-way valve 68 allowed to adjust a mixing rate of the bypassed coolant to the non-bypassed coolant is provided at a connection point of the bypass pipe 67 with the coolant return pipe 65. The three-way valve 68 is an electromagnetic valve (with a motor, in general), and a flow rate of the coolant passing through the dry coil 55 is controlled so that a temperature of the air-conditioned air after passing through the dry coil 55 becomes a predetermined temperature (a preset temperature).

When the temperature of the air-conditioned air measured by the outlet-side temperature sensor 69*a* provided in the outlet duct 52 is higher than a predetermined temperature, the cooling controller 63*b* controls the three-way valve 68 to flow more coolant to the dry coil 55, and when the temperature of the air-conditioned air measured by the outlet-side temperature sensor 69*a* is lower than a predetermined temperature, the cooling controller 63*b* controls the three-way valve 68 to flow more coolant on the bypass side so as not to pass through the dry coil 55.

Alternatively, when the bypass pipe 67 does not exist, it is possible to control the flow rate of the coolant by a two-way valve, and even by this method, the opening of the valve is automatically controlled for determining a through-flow rate of the coolant to the dry coil 55 so that the temperature of the air-conditioned air measured by the outlet-side temperature sensor 69*a* is adjusted to a predetermined temperature.

Thus, the flow rate of the coolant flowing to the dry coil 55 is controlled by the cooling controller 63*b*, and it is thereby possible to obtain air-conditioned air at a predetermined temperature. The cooling controller 63*b* is composed of a PLC.

A power INV (inverter) board 63*d* with variable output frequency is connected to the fan 54. The fan 54 rotates at a rotation speed corresponding to the output frequency of the power INV board 63*d*. A rotation speed controller 63*c* for controlling a rotation speed of the fan 54 by outputting the output frequency to the power INV board 63*d* is connected to the power INV board 63*d* so as to maintain the temperature of the air exhausted from the exhaust port 26 within a predetermined temperature range or at a predetermined temperature (e.g., 40-42° C.).

When a temperature t (a temperature of the air exhausted from the exhaust port 26) measured by the exhaust-side temperature sensor 69*b* provided in the exhaust air duct 53 is higher than a temperature $T_{high}$ which is a maximum threshold, the rotation speed controller 63*c* increases the rotation speed of the fan 54 by a certain value (e.g., the output frequency of the power INV board 63*d* is increased by 2 Hz per minute, alternatively, the increasing operation may be carried out at certain time intervals) based on a temperature $T_{high}$ as a preset maximum threshold (e.g., 42° C.) and a temperature $T_{low}$ as a minimum threshold (e.g., 40° C.). Meanwhile, when the temperature t measured by the exhaust-side temperature sensor 69*b* is lower than the temperature $T_{low}$ as a minimum threshold, the rotation speed controller 63*c* decreases the rotation speed of the fan 54 by a certain value (e.g., the output frequency of the power INV board 63*d* is decreased by 1 Hz per minute, alternatively, the decreasing operation may be carried out at certain time intervals). Alternatively, the frequency changing operation may be carried out by normal PID control or by a combination thereof, hence, the control method is not limited.

As described above, by controlling the rotation speed of the fan 54 using the rotation speed controller 63*c*, it is possible to adjust the temperature t of the air exhausted from the exhaust port 26, i.e., the temperature t of the air in the hot zone 24 within a desired temperature range (a temperature range from $T_{high}$ to $T_{low}$). When $T_{high}$ is equal to $T_{low}$ ($T_{high}=T_{low}$), it is possible to adjust the temperature t of the air exhausted from the exhaust port 26 (the temperature of the air in the hot zone 24) to a desired temperature $T_{high}$ (=$T_{low}$). The rotation speed controller 63*c* is composed of a PLC.

The air conditioner 51 is provided in a space other than the air-conditioned room 13 having the racks 12 arranged therein, e.g., in another room of the building where the data center 10 is established, or outside of the building. As a result, unlike the JP-A 2006-526205, pipes for coolant, etc., are not connected to the rack 12 (the rack row 15) and the air conditioner 51 is completely separated from the rack 12 (the rack row 15). In FIG. 5, although the air conditioner 51 is illustrated as if being provided above the ceiling, it is just for convenience.

In addition, for example, when the air conditioner 51 is installed in another space adjacent to the air-conditioned room 13, a floor surface level of the other space is desirably lower than that of the air-conditioned room 13, and it is possible to easily adapt this configuration by the present method. This is a device for making the coolant or the heating medium less likely to enter the inside of the air-conditioned room 13 even if the coolant supply pipe 64, the coolant return pipe 65, the heating medium supply pipe 58 and the heating medium discharge pipe 59 related to the air conditioner 51 are damaged and the coolant or the heating medium flows out.

Operations

Operations of the embodiment will be explained below.

Figure 6:
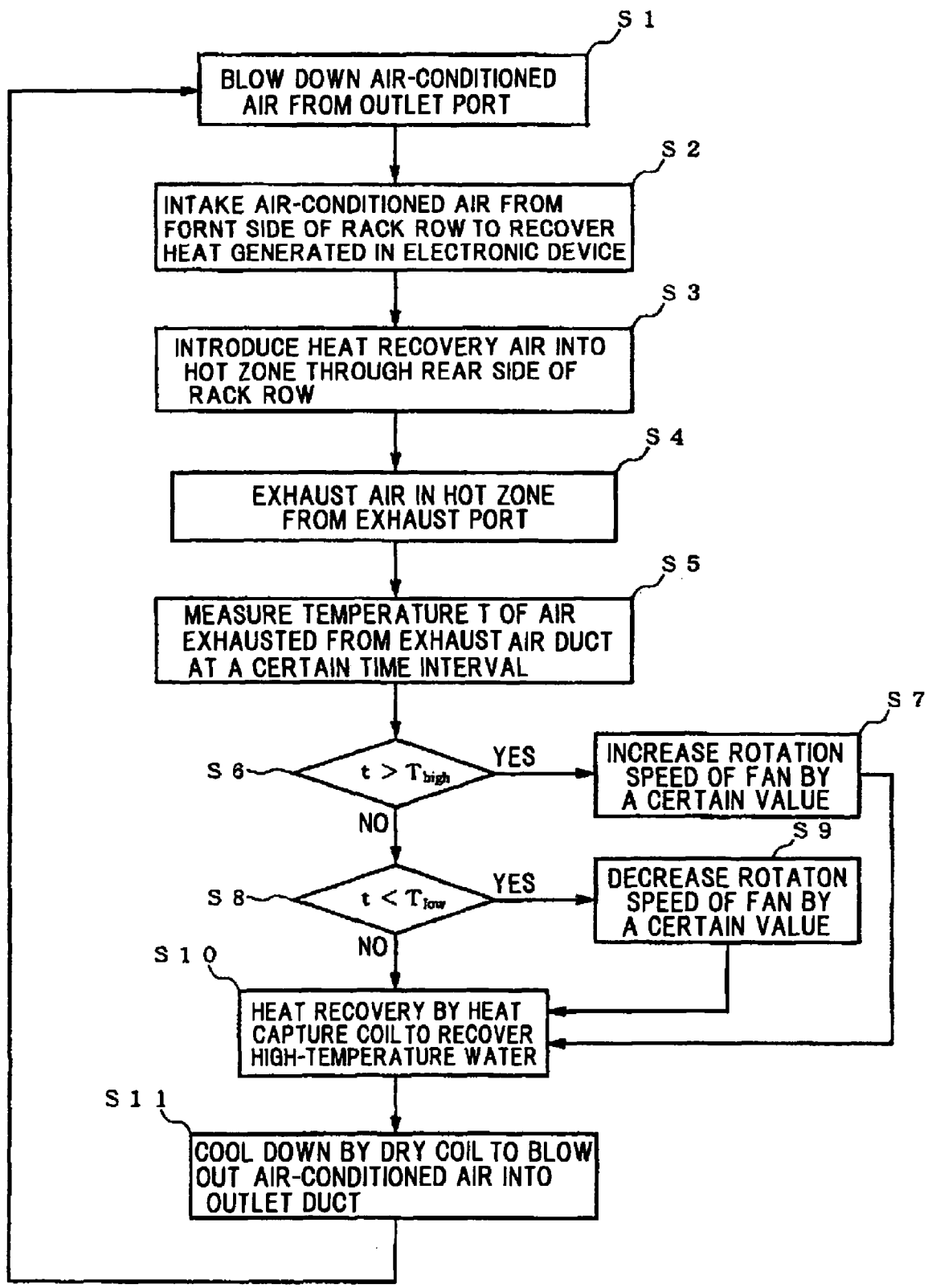
FIG. 6 is a flow chart for explaining an operation of the data center of the invention.
Figure 7:
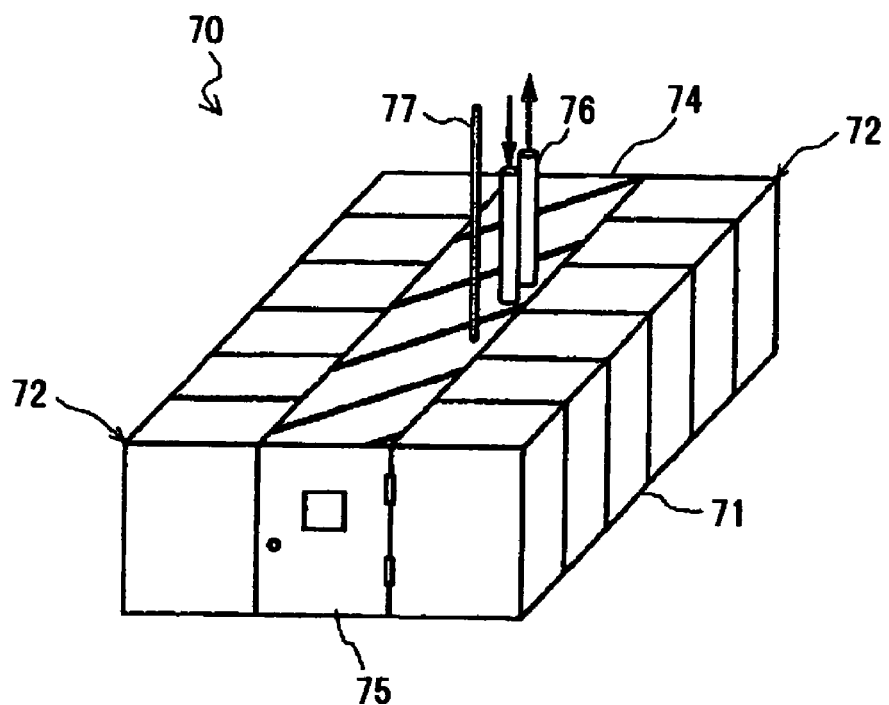
FIG. 7 is a perspective view showing a conventional data center.

As shown in FIG. 6, firstly, the air-conditioned air (cool air) blown out from the air-conditioned air outlet port of the air conditioner 51 is blown down from the outlet port 27 via an outlet duct 62, and is introduced into the air-conditioned room 13 (step S1). At this time, the rotation speed controller 63c controls the output frequency of the power INV board 63d and a rotation speed is adjusted such that an initial wind speed by which the fan 54 is expected to be appropriate is obtained. The temperature of the air-conditioned air is, e.g., about 23° C.

The air-conditioned air blown out into the air-conditioned room 13 is introduced into the rack 12 from the front side F of the rack row 15 by a fan of the electronic device 11 such as a server, and recovers the heat generated in the electronic device 11 in the rack 12 (step S2).

The air which recovered the heat generated in the electronic device 11 is introduced from the rear side R of the rack row 15 into the hot zone 24 (step S3). Since the heat discharged from the upper surface of the rack 12 (the rack row 15) is also introduced into the hot zone 24, all heat generated in the electronic device 11 is concentrated in the hot zone 24.

The air in the hot zone 24 is exhausted from the exhaust port 26 provided on the ceiling 20 in the hot zone 24 (step S4), and the temperature thereof is constantly and continuously measured by the exhaust-side temperature sensor 69b provided in the exhaust air duct 53 (step S5). The air which passed through the exhaust-side temperature sensor 69b is introduced into the inlet port of the air conditioner 51 via an exhaust air duct 63.

The rotation speed controller 63c compares the temperature $T_{high}$ as a preset maximum threshold with the temperature t measured by the exhaust-side temperature sensor 69b (step S6), and when t is greater than $T_{high}$ (t>$T_{high}$), the rotation speed controller 63c controls to increase the output frequency of the power INV board 63d by a certain value (e.g., by 2 Hz per minute) in order to increase the rotation speed of the fan 54 (step S7). As a result, since an outlet amount of the air-conditioned air from the air conditioner 51 is gradually increased and the amount of the air-conditioned air introduced into the rack 12 (the rack row 15) increases, it is possible to lower the temperature of the air in the hot zone 24.

Meanwhile, the rotation speed controller 63c compares the temperature $T_{low}$ as a preset minimum threshold with the temperature t measured by the exhaust-side temperature sensor 69b (step S8), and when t is less than $T_{low}$ (t<$T_{low}$), the rotation speed controller 63c controls to decrease the output frequency of the power INV board 63d by a certain value (e.g., by 1 Hz per minute) in order to decrease the rotation speed of the fan 54 (step S9). As a result, since an outlet amount of the air-conditioned air from the air conditioner 51 is gradually decreased and the amount of the air-conditioned air introduced into the rack 12 (the rack row 15) decreases, it is possible to raise the temperature of the air in the hot zone 24.

The air introduced into the inlet port of the air conditioner 51 passes through the fan 54, and is introduced into the heat capture coil 57 after removing the heat generated in the fan 54. The heat capture coil 57 recovers the heat of the air introduced by the fan 54, and recovers heating medium (heated water) at a high temperature which is closest to the temperature of this air (step S10). The high-temperature heating medium having passed through the heat capture coil 57 is exhausted to other equipments such as a boiler.

The air having passed through the heat capture coil 57 is introduced into the dry coil 55, is cooled down to a predetermined temperature (e.g., 23° C.) by the dry coil 55, and is blown out as the air-conditioned air (cool air) from the air-conditioned air outlet port of the air conditioner 51 (step S11).

By repeating the above steps S1 to S11, the temperature t of the air exhausted from the exhaust port 26, i.e., the temperature t of the air in the hot zone 24 can be adjusted within a temperature range from $T_{high}$ to $T_{low}$ (e.g., a temperature range of 40-42° C.), and it is possible to efficiently recover the heat by the heat capture coil 57.

Functions and Effects of the Embodiment

As described above, in the data center 10 of the embodiment, since the rack rows 15 are arranged so that the rear sides R thereof face each other and the partition 23 is provided at an upper front edge of each rack row 15, the heat discharged from the upper surface of the rack 12 is also introduced into the hot zone 24. Thus, the heat discharged from the upper surface of the rack 12 is not discharged into the air-conditioned room 13, and all heat generated in the electronic device 11 can be concentrated in the hot zone 24.

In addition, cool air coming out from the outlet port 27 is not mixed with the heat in the hot zone 24 due to the partition 23 and the ceiling sealing member 25. Thus, it is not necessary to adjust the temperature of the air-conditioned air to a low temperature (e.g., about 11-15° C.) which is equivalent to that for a conventional air conditioner.

As an effect thereof, it is not necessary to supply a low-temperature coolant (e.g., about 6-13° C.), which is standard in the prior art, to the air conditioner 51, and it is possible to cool down the electronic device 11 even when a supply temperature of the coolant is high (e.g., about 16-20° C.). As a result, since there is no unnecessary dehumidification at the dry coil 55 and it is not necessary to humidify which is required as a result of dehumidification, it is possible to efficiently produce the air-conditioned air (cool air) at a low cost.

In addition, in a selection of a cold source (e.g., a freezing machine or a cooling tower) which is a source to cool the coolant, a range of choice or an available period of the method are extended such that the coolant can be cooled by cold external air without using a freezing machine, hence, it is possible to further improve energy saving properties.

Since this method uses properties that heated air is likely to rise due to decrease in density and the density thereof is increased after cooling, it is possible to enhance mobility (convection) of the air-conditioned air and to reduce energy consumed as ventilation power by the air conditioner 51.

Furthermore, by intentionally maintaining the temperature in the hot zone 24 to high temperature, it is possible to enhance the above-mentioned effect for efficiently operating the air conditioner 51.

Therefore, as a whole, a large amount of energy is not consumed by the air conditioner 51, and it is possible to realize significant energy saving in a main air conditioner, which is a heat source side as well as an energy consumption side.

In addition, in the embodiment, the heat of the air exhausted from the exhaust port 26 is recovered by the heat recovery means 56 before cooling down by the dry coil 55, thus, it is possible to effectively use the heat concentrated in the hot zone 24 without diffusion.

In the embodiment, since the heat capture coil 57 is integrally provided with the air conditioner 51, it is possible to downsize as a whole. In addition, since the heat capture coil 57 is provided on a downstream side of the fan 54 and on an upstream side of the dry coil 55 concurrently, the heat generated in the fan 54 can be also recovered by the heat capture coil 57, thus, it is possible to realize more effective heat recovery. In addition, since the cooling by the dry coil 55 is carried out after recovering the heat by the heat capture coil 57, it is possible to reduce cooling energy cost for the dry coil 55.

In the embodiment, at least one outlet port 27 is formed on the ceiling of the air conditioned room 13 excluding the hot zone 24, and it is characterized by that the air-conditioned air is blown out "vertically downward" from the outlet port 27. As a result, even though the air-conditioned air is blown out at a slow wind speed (e.g., slight wind: 1 m/s or less) when being supplied, the descent due to a density difference with the surrounding environment creates air circulation energy, thereby allowing uniform supply of the air-conditioned air to the front side of the electronic device 11 (in general, having a separate cooling air inlet fan on the front side of the main body) discretely arranged in the rack 12 from a higher place to a lower place. As a result, since it is possible to sufficiently cool down the electronic device 11 even though the rotation speed of the fan 54 (circulation air volume in the air conditioned room 13) is small, it is possible to determined the rotation speed of the fan 54 giving priority to adjustment of the temperature t of the air in the hot zone 24 within a predetermined temperature range or at a predetermined temperature. Since it is possible to decrease the rotation speed of the fan 54, it is possible to reduce energy consumed by the fan 54 (the power required to circulate the air) as a result.

In the embodiment, since the rack row 15 is provided on the seismic isolator 17 and the rack row 15 is completely separated from the air conditioner 51 (not connected by pipes, etc.), there is no possibility that the electronic device 11 is damaged due to the damage of the pipes for coolant, etc., even in the event of an earthquake. In addition, by providing the panel 21 and the partition 23 movable with respect to the ceiling 20, even when the displacement difference is generated between the rack 12 (the rack row 15) and the building in the event of an earthquake, there is no possibility that the rack 12 falls over.

Modifications

In the above-mentioned embodiment, it has been explained that the rotation speed of the fan 54 is controlled so that the temperature t of the air in the hot zone 24 is within a predetermined temperature range or at a predetermined temperature. However, the rotation speed of the fan 54 may be controlled based on a temperature difference measured by the exhaust-side temperature sensor 69*b* and the outlet-side temperature sensor 69*a* so that a temperature difference between the air in the hot zone 24 and air conditioned room 13 (the air-conditioned air) coincides with a target value. As a result, it is possible to recover the heat at the most efficient temperature while cooling down the electronic device 11.

Although the rack rows 15 arranged in two rows has been explained in the above-mentioned embodiment, it is not limited thereto. It may be other geometric rows. Alternatively, the partition 23 may be provided at the upper front edge of plural racks 12 arranged instead of the panel 21.

The panels 21 extending from a lower edge of the rack row 15 to a ceiling 20 of the air-conditioned room 13 are each provided on both edge sides of the rack row 15 in a horizontal direction so as to block a gap between the rack rows 15 in the above-mentioned embodiment. However, while using one of them on one side as a panel 21 in the same manner as the embodiment, the side walls of the air-conditioned room 13 may be used for another edge side instead of the panel 21, and in this case, the side walls of the air-conditioned room 13 are assumed to be a panel 21.

The present invention is not limited to the above-mentioned embodiment, and it should be construed as embodying all modifications and alternative constructions that may occur to one skilled in the art which fairly fall within the basic teaching herein set forth.

Although the "panel" is distinguished from the "partition" in the invention, it does not mean that constituent materials are different, such that, e.g., material quality is different. A "partition" is a partition member on the rack for dividing the air-conditioned room, and a "panel" is a coupling member on an edge side of the rack row in a horizontal direction for connecting so as to block a gap between the rack rows (including the partition). The "panel" and the "partition" may have either one plate structure or a divided structure.

In conclusion, the data center described in JP-A 2006-526205 is a type in which the modular data center 70 is provided in the air-conditioned room, i.e., a completely modularized type. On the other hand, the invention is distinguished from the completely modularized type, and as described above, it is a partially modularized type which is earthquake-proof and is partially merged with the energy-saving air-conditioned room.

What is claimed is:
1. A data center, comprising:
an air-conditioned room;
two rack rows formed on a floor surface of the air-conditioned room and each composed of a plurality of racks arranged in a horizontal direction, each of the plurality of racks housing electronic devices in multistage configuration;
an air conditioner for conditioning air in the air-conditioned room to eliminate heat generated from the electronic devices housed in the plurality of racks, the air conditioner being provided in a room other than the air-conditioned room having the racks arranged therein, or outside of a building;
a hot zone in the air-conditioned room, the hot zone being defined by the floor surface, the two rack rows arranged on the floor surface of the air-conditioned room such that rear sides thereof are opposite each other at a distance, a ceiling disposed above the two rack rows, two panels disposed at both ends of the two rack rows in the horizontal direction and extending from a lower end of the two rack rows to the ceiling, and two partitions disposed at a front top end of the two rack rows and extending to the ceiling;
a plurality of exhaust ports for sucking and discharging air having a decreased density in the hot zone upward, the plurality of exhaust ports being disposed on the ceiling of the air-conditioned room on the hot zone to face to the two rack rows in the horizontal direction in a plan view;

a plurality of outlet ports for blowing air-conditioned air having a density greater than the decreased density from the air conditioner vertically downward, the plurality of outlet ports being disposed on the ceiling on a front side of the two rack rows in the air-conditioned room except the hot zone to face to the two rack rows respectively in the horizontal direction in the plan view;

an exhaust air duct connecting the air conditioner and the plurality of exhaust ports, the exhaust air duct being provided on a back side of the ceiling of the air-conditioned room to face to the two rack rows in the plan view; and an outlet duct connecting the air conditioner and the plurality of outlet ports, the outlet duct being provided on a back side of the ceiling of the air-conditioned room to face to the two rack rows in the plan view, wherein the exhaust air duct and the outlet duct comprise parts facing to the two rack rows in the plan view respectively, and the parts are linear and spaced from each other in the plan view, and wherein the air conditioner is operable to introduce the air-conditioned air, which has been blown from the plurality of outlet ports via the outlet duct to the air-conditioned room vertically downward, through front sides and then the rear sides of the two rack rows into the hot zone, and thereafter to introduce the air in the hot zone from the plurality of exhaust ports via the exhaust air duct into the air conditioner, thereby enhancing mobility of the air-conditioned air.

2. The data center according to claim 1, wherein
the heat recovery means comprises a heat capture coil for recovering a heat from the air discharged through the plurality of exhaust ports, and
the heat capture coil is integrated with the air conditioner.

3. The data center according to claim 2, wherein
the air conditioner comprises a fan for sucking the air in the hot zone and a dry coil disposed at a downstream side of the fan for cooling down the air sent through the fan and for blowing out the air-conditioned air, and
the heat capture coil is disposed at the downstream side of the fan and at an upstream side of the dry coil.

4. The data center according to claim 3, wherein
the heat capture coil is adapted to recover a heat of the air sent through the fan and to convert the heat into a heat of a heating medium,
the heat capture coil comprises a heat recovery controller for controlling a flow rate of the heating medium so as to maximize a temperature of the heating medium, and
the dry coil comprises a cooling controller for controlling a flow rate of a coolant so as to have a predetermined temperature of the air-conditioned air after passing through the dry coil.

5. The data center according to claim 3, wherein the fan comprises a rotation speed controller for controlling a rotation speed of the fan so as to keep the air sucked from the hot zone in a predetermined temperature range or at a predetermined temperature.

6. The data center according to claim 1, further comprising a heat recovery means for recovering a heat of the air discharged through the plurality of exhaust ports from the hot zone before cooling down the air by the air conditioner.

7. The data center according to claim 1, wherein the two rack rows are completely separated from the air conditioner.

8. The data center according to claim 1, further comprising a seismic isolator, the two rack rows being mounted on the seismic isolator.

9. The data center according to claim 8, wherein the seismic isolator comprises:
a base member disposed on the floor surface; and
a seismic isolation platform disposed on the base member, the two rack rows being mounted on the seismic isolation platform.

10. The data center according to claim 1, further comprising a ceiling sealing member disposed at an upper edge of the two panels and the two partitions.

11. The data center according to claim 1, further comprising an exhaust-side temperature sensor provided at the exhaust air duct, the exhaust-side temperature sensor being configured to measure a temperature of air taken from the hot zone.

12. A data center, comprising:
an air-conditioned room;
two rack rows formed on a floor surface of the air-conditioned room and each composed of a plurality of racks arranged in a horizontal direction, each of the plurality of racks housing electronic devices in multistage configuration;
an air conditioner for conditioning air in the air-conditioned room to eliminate heat generated from the electronic devices housed in the plurality of racks; and
a hot zone in the air-conditioned room, the hot zone being defined by the floor surface, the two rack rows arranged on the floor surface of the air-conditioned room such that rear sides thereof are opposite each other at a distance, a ceiling disposed above the two rack rows, two panels disposed at both ends of the two rack rows in the horizontal direction and extending from a lower end of the two rack rows to the ceiling, and two partitions disposed at a front top end of the two rack rows and extending to the ceiling,
wherein the ceiling comprises an exhaust port for discharging air in the hot zone from the hot zone,
wherein the air conditioner is operable to introduce air-conditioned air from the air-conditioned room through front sides and then the rear sides of the two rack rows into the hot zone,
wherein the data center further comprises a heat recovery means for recovering a heat of the air discharged through the exhaust port from the hot zone before cooling down the air by the air conditioner,
wherein the heat recover means comprises a heat capture coil recovering a heat from the air discharged through the exhaust port,
wherein the heat capture coil is integrated with the air conditioner,
wherein the air conditioner comprises a fan for sucking the air in the hot zone and a dry coil disposed at a downstream side of the fan for cooling down the air sent through the fan and for blowing out the air-conditioned air,
wherein the heat capture coil is disposed at the downstream side of the fan and at an upstream side of the dry coil,
wherein the data center further comprises:
an exhaust air duct for connecting the air conditioner with the exhaust port; and
an outlet duct for connecting the air conditioner with an outlet port formed in the air-conditioned room except the hot zone,
wherein the exhaust air duct and the outlet duct each comprise a temperature sensor, and
wherein the fan comprises a rotation speed controller for controlling a rotation speed of the fan based on a temperature difference measured by the temperature sensor so that a temperature difference between the air-conditioned room and the hot zone coincides with a target value.

13. The data center according to claim 12, wherein the outlet port is formed on a ceiling of the air-conditioned room except the hot zone, and adapted to blow out the air-conditioned air vertically downward.

* * * * *